(12) United States Patent
Chung et al.

(10) Patent No.: US 7,361,604 B2
(45) Date of Patent: *Apr. 22, 2008

(54) METHOD FOR REDUCING DIMENSIONS BETWEEN PATTERNS ON A HARDMASK

(75) Inventors: Henry Wei-Ming Chung, Hsinchu (TW); Shin-Yi Tsai, Hsinchu (TW); Ming-Chung Liang, Hsinchu (TW)

(73) Assignee: Macronix International Co., Ltd. (TW)

( * ) Notice: Subject to any disclaimer, the term of this patent is extended or adjusted under 35 U.S.C. 154(b) by 455 days.

This patent is subject to a terminal disclaimer.

(21) Appl. No.: 10/465,852

(22) Filed: Jun. 20, 2003

(65) Prior Publication Data

US 2003/0224602 A1 Dec. 4, 2003

Related U.S. Application Data

(63) Continuation-in-part of application No. 09/978,546, filed on Oct. 18, 2001, now Pat. No. 6,750,150.

(60) Provisional application No. 60/390,183, filed on Jun. 21, 2002.

(51) Int. Cl.
*H01L 21/302* (2006.01)
*H01L 21/461* (2006.01)

(52) U.S. Cl. ............. 438/706; 439/689; 439/725; 216/58

(58) Field of Classification Search .......... 438/706, 438/313, 396
See application file for complete search history.

(56) References Cited

U.S. PATENT DOCUMENTS

| 5,276,347 A * | 1/1994 | Wei et al. .................... 257/388 |
| 5,618,383 A * | 4/1997 | Randall ....................... 430/314 |
| 5,770,510 A * | 6/1998 | Lin et al. .................... 438/396 |
| 5,895,740 A * | 4/1999 | Chien et al. ................. 430/313 |
| 6,100,014 A * | 8/2000 | Lin et al. .................... 430/314 |
| 6,780,782 B1 * | 8/2004 | Tsai et al. .................... 438/725 |

* cited by examiner

*Primary Examiner*—Nadine G. Norton
*Assistant Examiner*—Patricia A. George
(74) *Attorney, Agent, or Firm*—Yitai Hu; Akin Gump Strauss Hauer & Feld LLP

(57) ABSTRACT

A semiconductor manufacturing method that includes depositing a first layer over a substrate, providing a layer of hardmask over the first layer, patterning and defining the hardmask layer to form at least two hardmask structures, wherein each hardmask structure includes at least one substantially vertical sidewall and one substantially horizontal top, and wherein the hardmask structures are separated by a first space, depositing a photo-insensitive material over the at least two hardmask structures and the first layer, wherein an amount of the photo-insensitive material deposited on the top of the hardmask structures is substantially greater than an amount of the photo-insensitive material deposited on the at least one sidewall of the hardmask structures, wherein the hardmask structures with the photo-insensitive layer on the sidewalls thereof are separated by a second space, and wherein the first space is greater than the second space.

28 Claims, 4 Drawing Sheets

METHOD FOR REDUCING DIMENSIONS BETWEEN PATTERNS ON A HARDMASK

RELATED APPLICATION

This application is a continuation-in-part application of U.S. application Ser. No. 09/978,546, entitled "Method for Reducing Dimensions Between Patterns on a Photoresist," filed on Oct. 18, 2001, now U.S. Pat. No. 6,750,150 and claims priority to U.S. Provisional Application Ser. No. 60/390,183, entitled "Sub-90 nm Space and Hole Patterning Using 248 nm Lithography with Plasma-Polymerization Coating," filed on Jun. 21, 2002. This application is also related to concurrently-filed U.S. application Ser. No. 10/465,848, entitled "Method for Reducing Dimensions Between Patterns on a Photomask," and U.S. application Ser. No. 10/45,850, entitled "Method for Reducing Dimensions Between Patterns on a Photoresist." These related applications are expressly incorporated herein by reference.

DESCRIPTION OF THE INVENTION

1. Field of the Invention

This invention relates in general to a semiconductor manufacturing process and, more particularly, to a photolithographic method having reduced dimensions between patterns on a hardmask.

2. Background of the Invention

With sub-micron semiconductor manufacturing process being the prevalent technology, the demand for a high-resolution photolithographic process has increased. The resolution of a conventional photolithographic method is primarily dependent upon the wavelength of a light source, which dictates that there be a certain fixed distance between patterns on a photoresist. Distance separating patterns smaller than the wavelength of the light source could not be accurately patterned and defined.

Prior art light sources with lower wavelengths are normally used in a high-resolution photolithographic process. In addition, the depth of focus of a high-resolution photolithographic process is shallower compared to a relative low-resolution photolithographic process. As a result, a photoresist layer having a lower thickness is required for conventional photolithographic methods. However, a photoresist layer having a lower thickness is susceptible to the subsequent etching steps in a semiconductor manufacturing process. This relative ineffective resistance to etching reduces the precision of patterning and defining of a photoresist. These limitations prevent the dimensions of patterns on a photoresist from being reduced.

There are situations when a photoresist is not suitable for a particular application, for example, unable to withstand a particular etching recipe. Therefore, a hardmask (or mask) may be used in the place of a photoresist. A hardmask may be patterned and defined through the conventional photolithography process. Similarly, the feature size of the patterned hardmask plays an important role in device scaling.

It is accordingly a primary object of the invention to provide a method for reducing the distance separating patterns on a photoresist layer. In addition, it is another object of the invention to provide a method to enhance the etching resistance of a patterned photoresist layer.

SUMMARY OF THE INVENTION

In accordance with the invention, there is provided a semiconductor manufacturing method that includes depositing a layer of semiconductor material over a semiconductor substrate, providing a hardmask layer over the layer of semiconductor material, providing a layer of photoresist over the hardmask layer, patterning and defining the photoresist layer, etching the hardmask layer to form at least one hardmask structure, removing the patterned and defined photoresist layer, depositing a layer of inorganic material over the hardmask structure, wherein the layer of inorganic material is photo-insensitive, anisotropic etching the layer of inorganic material and the layer of semiconductor material, and removing the hardmask structure.

Also in accordance with the present invention, there is provided a semiconductor manufacturing method that includes defining a substrate, depositing a first layer over the substrate, providing a mask layer over the first layer, providing a layer of photoresist over the mask layer, patterning and defining the photoresist layer, etching the mask layer to form a plurality of mask structures having at least one substantially vertical sidewall and one substantially horizontal top, removing the patterned and defined photoresist layer, depositing a photo-insensitive material over the plurality of mask structures and the first layer, wherein an amount of the photo-insensitive material deposited on the top of the mask structures is substantially greater than an amount of the photo-insensitive material deposited on the at least one sidewall of the mask structures, etching the photo-insensitive material and the first layer, and removing the plurality of mask structures.

Further in accordance with the present invention, there is provided a semiconductor manufacturing method that includes defining a substrate, providing a first layer over the substrate, providing a mask layer over the first layer, patterning and defining the mask layer to form at least two mask structures, wherein each of the mask structures includes substantially vertical sidewalls and a substantially horizontal top, and wherein the mask structures are separated by a space, depositing a layer of polymer on the tops of the mask structures and the space separating the mask structures, wherein an amount of the polymer deposited on the tops of the mask structures is substantially greater than an amount of the polymer deposited on the sidewalls of the mask structures, and etching the polymer layer on the tops of the mask structures and the space between the mask structures, and the first layer.

Still further in accordance with the present invention, there is provided a semiconductor manufacturing method that includes defining a substrate, depositing a first layer over the substrate, providing a layer of hardmask over the first layer, patterning and defining the hardmask layer to form at least two hardmask structures, wherein each hardmask structure includes at least one substantially vertical sidewall and one substantially horizontal top, and wherein the hardmask structures are separated by a first space, depositing a photo-insensitive material over the at least two hardmask structures and the first layer, wherein an amount of the photo-insensitive material deposited on the top of the hardmask structures is substantially greater than an amount of the photo-insensitive material deposited on the at least one sidewall of the hardmask structures, wherein the hardmask structures with the photo-insensitive layer on the sidewalls thereof are separated by a second space, and wherein the first space is greater than the second space, etching the photo-insensitive material and the layer of the semiconductor material, and removing the at least one hardmask structure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

Figure 1:
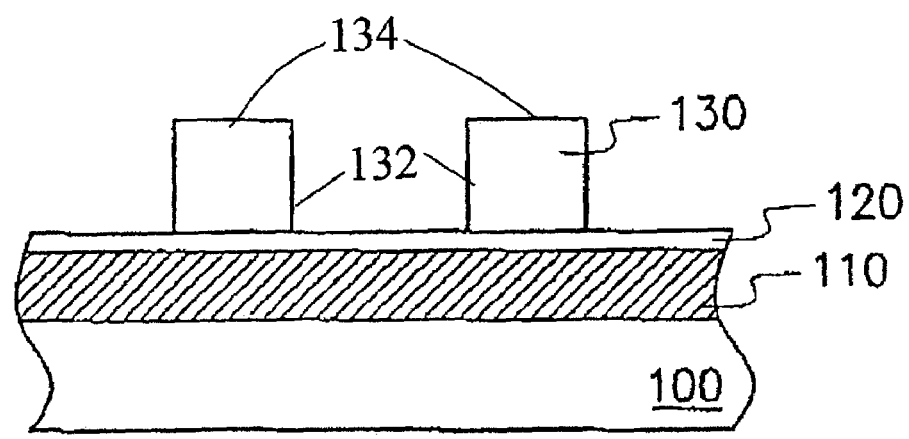
FIGS. 1-4F are cross-sectional views of the semiconductor manufacturing process steps of the present invention.

FIGS. 1-4F are cross-sectional views of the semiconductor manufacturing process steps of the present invention. Referring to FIG. 1, the method of the present invention begins by defining a wafer substrate 100. Wafer substrate 100 may be of any known semiconductor substrate material, such as silicon. A first layer 110 is then provided over the wafer substrate 100. In one embodiment, first layer 110 is a semiconductor material, such as polysilicon. First layer 110 may also be a dielectric layer or a metal layer. First layer 110 may be deposited over wafer substrate 100 by any known deposition process. In another embodiment, first layer 110 is a dielectric material, in which case first layer 110 may be deposited or grown over wafer substrate 100.

An anti-reflection coating (ARC) layer 120 may optionally be provided over first layer 110 to decrease the reflection from first layer 110 in the subsequent manufacturing steps. A photoresist layer 130 is then provided over ARC layer 120. In an embodiment in which an ARC layer is not provided, photoresist layer 130 is deposited over first layer 110. Photoresist layer 130 is then patterned and defined using a known photolithographic process to form a patterned and defined photoresist layer having a plurality of photoresist structures 130. Photoresist structures 130 include substantially vertical sidewalls 132 and substantially horizontal tops 134. When first layer 110 is a semiconductor material, photoresist structures 130 functions to form conductors from first layer 110.

Figure 2:
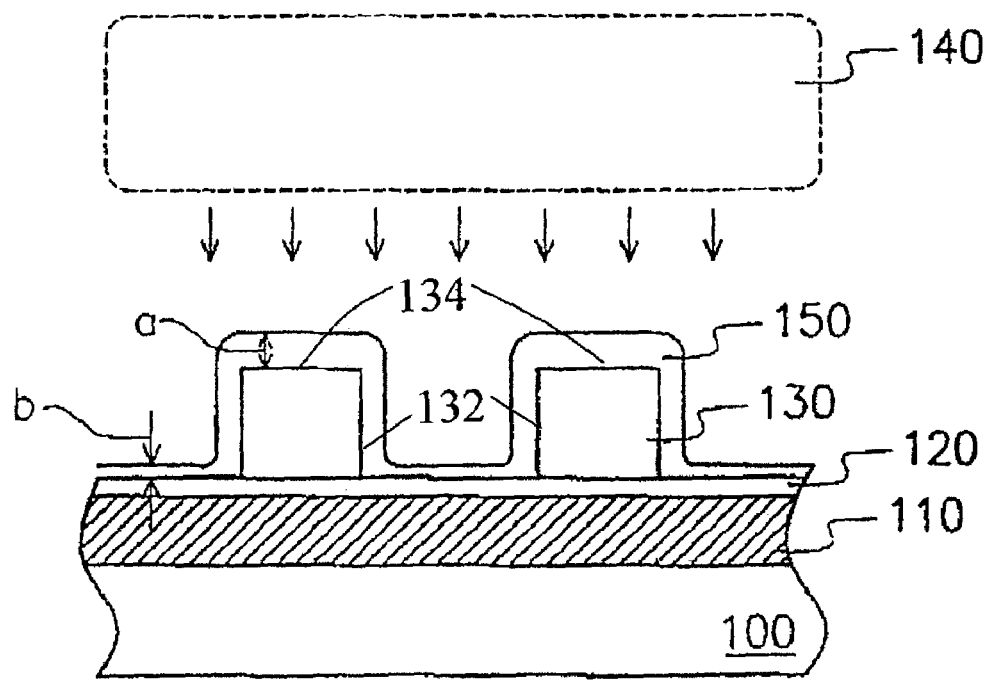

Referring to FIG. 2, a second layer 150 is deposited over patterned and defined photoresist layer 130 by a known chemical vapor deposition apparatus 140. Known chemical vapor deposition processes include plasma enhanced chemical vapor deposition (PECVD) and low pressure chemical vapor deposition (LPCVD). Second layer 150 may be organic or inorganic, and is photo-insensitive. In one embodiment, second layer 150 is a polymer layer. In another embodiment, second layer 150 is substantially conformal, covering both tops 134 and sidewalls 132 of photoresist structures 130. In one embodiment, the amount of second layer 150 deposited on tops 134 of photoresist structures 130 is substantially greater than the amount adhered to sidewalls 132. Having a substantially more of second layer 150 deposited on tops 134, photoresist structures 130 become more resistive to the subsequent etching steps, thereby preserving the precision of the photolithographic process. In addition, the step of depositing second layer 150 is performed at a temperature lower than the stability temperature of photoresist structures 130. In other words, second layer 150 is deposited at a temperature not affecting the structural stability of photoresist structures 130.

After the deposition of second layer 150, the space between photoresist structures 130 is decreased, for example, from 0.22 microns to 0.02 microns.

In the PECVD process, the pressure used is in the range of approximately 5 mTorr to 30 mTorr. The source power ranges from approximately 900 watts to 1800 watts and the bias power ranges from 0 to 1300 W. The deposition rate is between approximately 3,000 Å per minute and ,000 Å per minute. In addition, polymer layer 150 comprises at least one hydrocarbon partially substituted by fluorine, the source for forming polymers. The partially-substituted hydrocarbons may be chosen from difluoromethane ($CH_2F_2$), a mixture of difluoromethane and octafluorobutene ($C_4F_8$), and a mixture of difluoromethane and trifluoromethane ($CHF_3$). In one embodiment, when the partially-substituted hydrocarbons include $CH_2F_2$ only, the thickness "a" of a portion of the polymer layer 150 is the same as the thickness "b" of another portion of the polymer layer 150.

Moreover, argon (Ar) and carbon monoxide (CO) may be mixed with the gases introduced during the PECVD process. Argon acts as a carrier to enhance etch uniformity of photoresist layer 130 and ARC layer 120. The function of carbon monoxide is to capture fluorine radicals and fluoride ions generated by the fluoro-substituted hydrocarbons. As such, etching of the polymers during the deposition process is prevented, thereby enhancing the deposition rate of polymer layer 150. Oxygen ($O_2$) and nitrogen ($N_2$) gases also can be added to the PECVD process. Contrary to the function of the carbon monoxide, the presence of oxygen serves to etch polymer layer 150. Therefore, the deposition rate of polymer layer 150 can be controlled. Also, perfluorohydrocarbons, such as hexafluoroethane ($C_2F_6$) and tetrafluoromethane ($CF_4$), can be mixed with the gases combined with the plasma during deposition because these gases, similar to the oxygen gas, etch polymer layer 150.

In one embodiment, when the gases used during deposition of second layer 150 include approximately 10 to 30 sccm of $C_4F_8$, 10 to 30 sccm of $CH_2F_2$, 50 to 150 sccm of CO, and 100 to 300 sccm of argon (Ar), the amount of second layer 150 deposited on tops 134 of the photoresist structures 130 is substantially greater than the amount adhered to sidewalls 132. In another embodiment, when the gases used during deposition of second layer 150 include approximately 10 to 30 sccm of $C_4F_8$, 0 to 15 sccm of $CH_2F_2$, 0 to 50 sccm of CO, and 100 to 300 sccm of argon (Ar), and the bias power is greater than approximately 400 W, the amount of second layer 150 deposited on tops 134 of photoresist structures 130 is substantially less than the amount adhered to sidewalls 132.

Figure 3A:
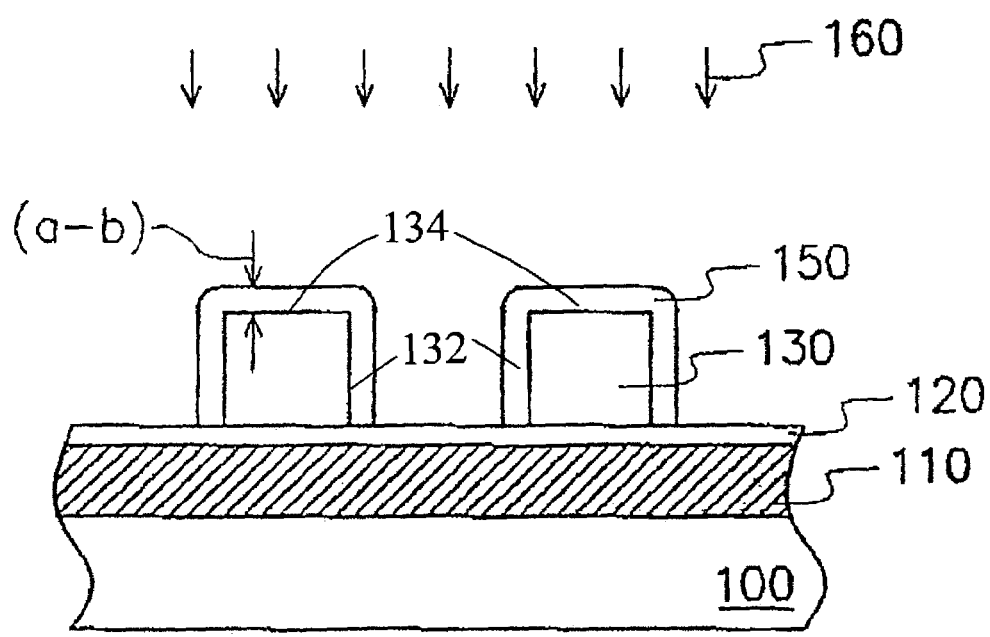
Figure 3B:
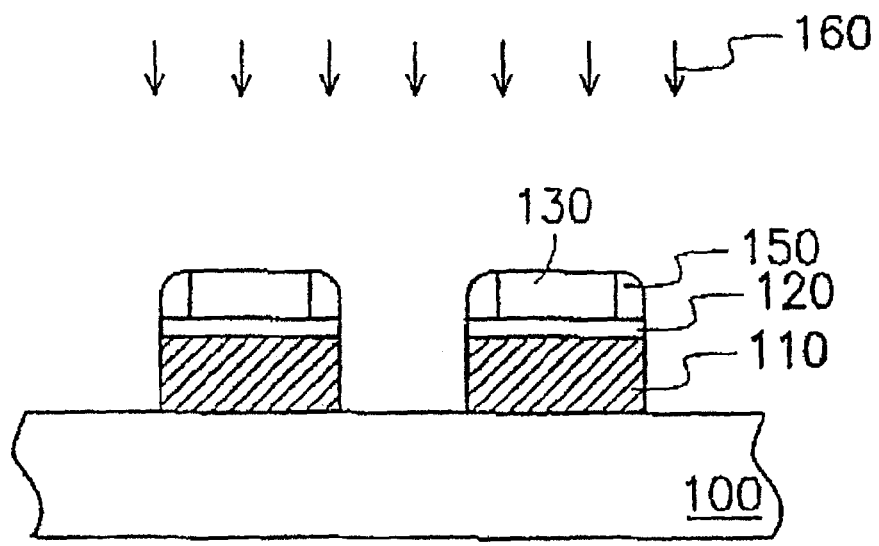

Referring to FIGS. 3A and 3B, second layer 150, photoresist structures 130, ARC layer 120, and first layer 110 are etched anisotropically with a plasma-based dry etching process. The dry etching process uses plasma 10 as etchant. In an embodiment in which "a"0 is thicker than "b," the thickness of second layer 150 changes from "a" to "a-b" after second layer 150 deposited over ARC layer 120 is completely etched away. This shows that second layer 150 provides excellent resistance to the plasma etch process and therefore enhances the etching resistance of photoresist structures 130.

As shown in FIG. 3B, when the anisotropic dry etching process continues, second layer 150 acts as an etch stop and remains on the sidewalls of photoresist structures 130. Thus, the dimensions between the patterned photoresist and underlying patterned first layer 110 are reduced. Photoresist structures 130 may be removed using any conventional process.

Figure 4A:
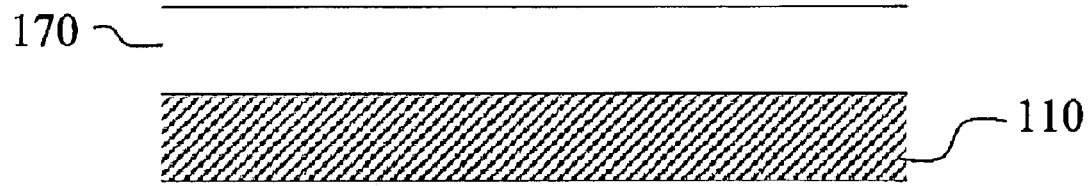
Figure 4B:
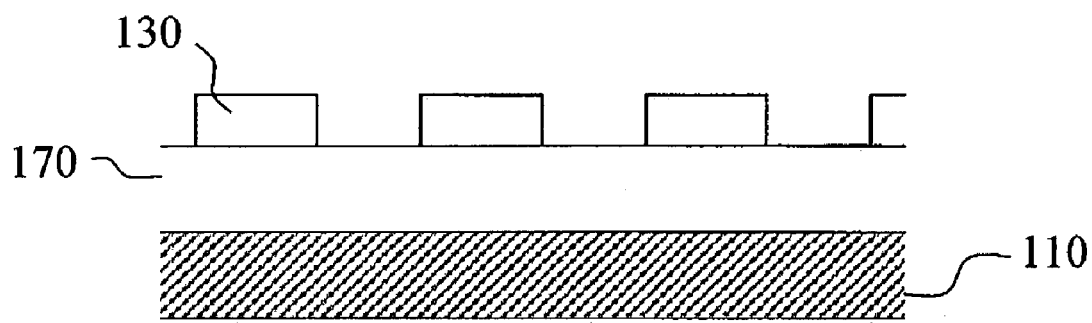

FIGS. 4A-4F show a method consistent with one embodiment of the present invention, in which a hardmask, instead of a photoresist, is used as a mask for subsequent etching of first layer 110. Referring to FIG. 4A, an ARC layer 120 may optionally be provided over first layer 110 to decrease the reflection from first layer 110 in subsequent manufacturing steps. A layer of hardmask material 170 is then provided over ARC layer 120. In an embodiment in which an ARC layer is not provided, hardmask layer 170 is deposited over first layer 110. Hardmask layer 170 may be composed of any known hardmask material including, but not limited to, polysilicon, oxide, and nitride. Photoresist film 130 is then provided over hardmask layer 170 and is patterned and defined as shown in FIG. 4B.

Figure 4C:
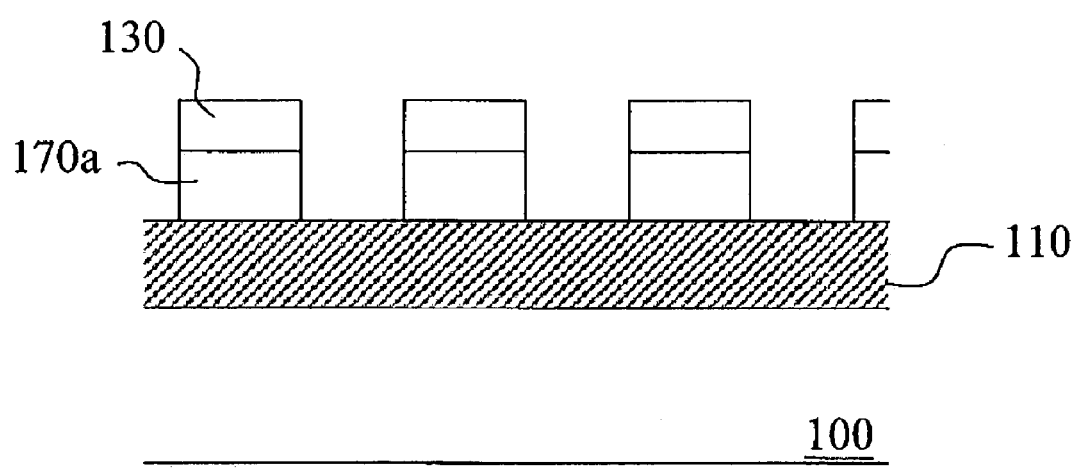
Figure 4D:
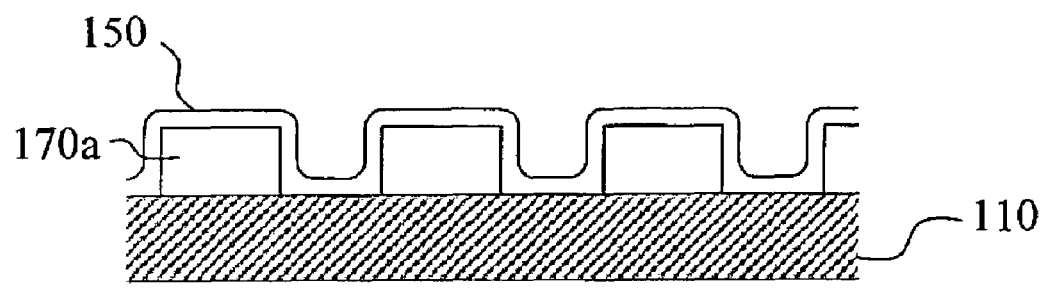

Referring to FIG. 4C, a first etching of hardmask layer 170 is performed using patterned and defined photoresist 130 as a mask to form one or more hardmask structures 170a. Patterned and defined photoresist 130 is then removed. The manufacturing process described above then follows to complete the method of the present invention. In particular, referring to FIG. 4D, second layer 150 is deposited over patterned and defined hardmask structures 170a. After the deposition of second layer 150, the space between hardmask structures 170a is decreased.

Figure 4E:
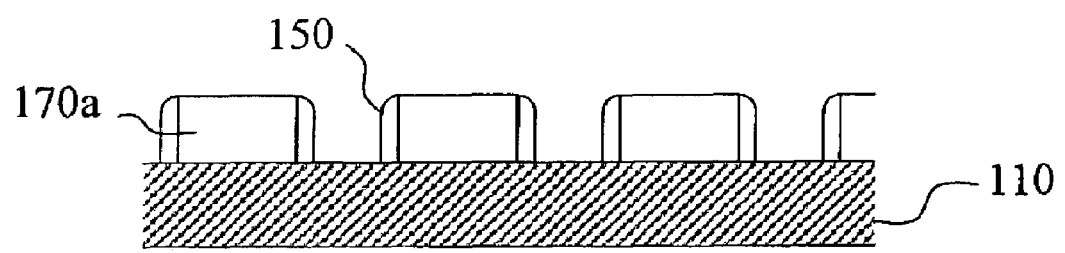
Figure 4F:
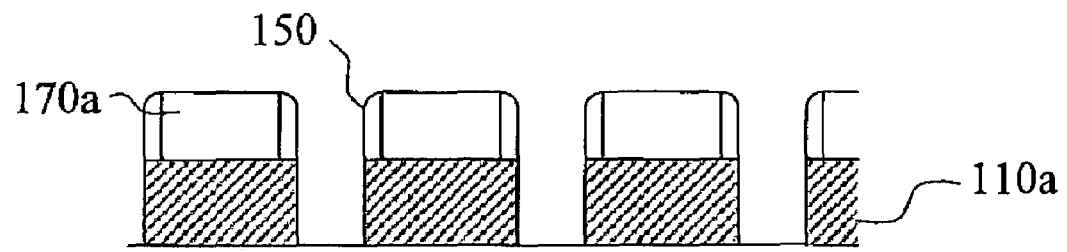

Referring to FIG. 4E, an anistropic etching is performed to etch away second layer 150 deposited over the surface of first layer 110 between hardmask structures 170a, and at the same time, second layer 150 provided over the top surface of the one or more hardmask structures 170a may also be etched away. As shown in FIG. 4E, the resulted structure includes the one or more hardmask structures 170a and second layer 150 on sidewalls of the one or more mask structures 170a. The one or more hardmask structures 170a and second layer 150 on the sidewalls thereof serve as a mask for the subsequent etching processes of first layer 110 which results in the structure shown in FIG. 4F. The one or more hardmask structures 170a and second layer 150 are then removed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing method, comprising:
   depositing a layer of semiconductor material over a semiconductor substrate;
   providing a hardmask layer over the layer of semiconductor material;
   providing a layer of photoresist over the hardmask layer;
   patterning and defining the photoresist layer;
   etching the hardmask layer to form at least one hardmask structure;
   removing the patterned and defined photoresist layer;
   depositing a layer of inorganic material over the hardmask structure, wherein the layer of inorganic material is photo-insensitive;
   anisotropic etching the layer of inorganic material and the layer of semiconductor material; and
   removing the hardmask structure.

2. The method as claimed in claim 1, wherein the hardmask layer comprises one of oxide, nitride, or polysilicon.

3. The method as claimed in claim 1, wherein the layer of inorganic material is substantially conformal.

4. The method as claimed in claim 1, wherein the step of depositing a layer of inorganic material is performed at a temperature lower than a stability temperature of the patterned and defined photoresist layer.

5. The method as claimed in claim 1 further comprising a step of depositing an anti-reflection coating over the layer of semiconductor material.

6. The method as claimed in claim 1, wherein the layer of semiconductor material comprises one of polysilicon, dielectric material or metallic material.

7. A semiconductor manufacturing method, comprising:
   defining a substrate;
   depositing a first layer over the substrate;
   providing a mask layer over the first layer;
   providing a layer of photoresist over the mask layer;
   patterning and defining the photoresist layer;
   etching the mask layer to form a plurality of mask structures having at least one substantially vertical sidewall and one substantially horizontal top;
   removing the patterned and defined photoresist layer;
   depositing a photo-insensitive material over the plurality of mask structures and the first layer, wherein an amount of the photo-insensitive material deposited on the top of the mask structures is substantially greater than an amount of the photo-insensitive material deposited on the at least one sidewall of the mask structures;
   etching the photo-insensitive material and the first layer; and
   removing the plurality of mask structures.

8. The method as claimed in claim 7, wherein the step of depositing a photo-insensitive material comprises a step of depositing a layer of polymer.

9. The method as claimed in claim 7, wherein the photo-insensitive material is inorganic.

10. The method as claimed in claim 7, wherein the mask layer comprises one of oxide, nitride, or polysilicon.

11. A semiconductor manufacturing method, comprising:
    defining a substrate;
    providing a first layer over the substrate;
    providing a mask layer over the first layer;
    patterning and defining the mask layer to form at least two mask structures, wherein each of the mask structures includes substantially vertical sidewalls and a substantially horizontal top, and wherein the mask structures are separated by a space;
    depositing a layer of polymer on the tops of the mask structures and the space separating the mask structures, wherein an amount of the polymer deposited on the tops of the mask structures is substantially greater than an amount of the polymer deposited on the sidewalls of the mask structures; and
    etching the polymer layer on the tops of the mask structures and the space between the mask structures, and the first layer.

12. The method as claimed in claim 11, wherein the mask layer comprises one of oxide, nitride, or polysilicon.

13. The method as claimed in claim 11, wherein the step of depositing a layer of polymer is performed at a temperature lower than a stability temperature of the patterned and defined mask layer.

14. The method as claimed in claim 11, wherein the first layer comprises one of polysilicon, dielectric material, or metallic material.

15. A semiconductor manufacturing method, comprising:
defining a substrate;
providing a first layer formed from a semiconductor material and formed over the substrate;
providing a layer of mask over the first layer;
patterning and defining the mask layer to form at least two mask structures, wherein each of the mask structures includes substantially vertical sidewalls and a substantially horizontal top, and wherein the mask structures are separated by a first space;
depositing a photo-insensitive layer on the sidewalls of the mask structures such that the mask structures with the photo-insensitive layer on the sidewalls thereof are separated by a second space, wherein the first space is greater than the second space; and
anisotropic etching of the photo-insensitive layer.

16. The method as claimed in claim 15, wherein the anisotropic etching comprises etching the first layer using the mask structures and the photo-insensitive layer on the sidewalls of the mask structures as a mask to form at least two first layer structures separated by a third space, and wherein the third space is narrower than the first space.

17. The method as claimed in claim 15, wherein the first layer comprises polysilicon.

18. A semiconductor manufacturing method, comprising:
defining a substrate;
depositing a first layer over the substrate;
providing a layer of hardmask over the first layer;
patterning and defining the hardmask layer to form at least two hardmask structures, wherein each hardmask structure includes at least one substantially vertical sidewall and one substantially horizontal top, and wherein the hardmask structures are separated by a first space;
depositing a photo-insensitive material over the at least two hardmask structures and the first layer, wherein an amount of the photo-insensitive material deposited on the top of the hardmask structures is substantially greater than an amount of the photo-insensitive material deposited on the at least one sidewall of the hardmask structures, wherein the hardmask structures with the photo-insensitive layer on the sidewalls thereof are separated by a second space, and wherein the first space is greater than the second space;
etching the photo-insensitive material and the layer of the semiconductor material; and
removing the at least one hardmask structure.

19. The method as claimed in claim 18, further comprising a step of depositing a layer of polymer.

20. The method as claimed in claim 18, wherein the step of depositing a layer of photo-insensitive material is performed at a temperature lower than a stability temperature of the patterned and defined hardmask structures.

21. A semiconductor manufacturing method, comprising:
defining a substrate;
providing a first layer over the substrate;
providing a layer of hardmask over the first layer;
patterning and defining the hardmask layer to form at least two hardmask structures, wherein each of the hardmask structures includes substantially vertical sidewalls and a substantially horizontal top, and wherein the hardmask structures are separated by a first space;
depositing a photo-insensitive layer on the sidewalls of the hardmask structures such that the hardmask structures with the photo-insensitive layer on the sidewalls thereof are separated by a second space, wherein the first space is greater than the second space; and
anisotropic etching of the photo-insensitive layer.

22. The method as claimed in claim 21, further comprising anisotropic etching the first layer using the hardmask structures and the photo-insensitive layer on the sidewalls of the hardmask structures as a mask to form at least two first layer structures separated by a third space, and wherein the third space is narrower than the first space.

23. The method as claimed in claim 21, wherein the first layer comprises one of polysilicon, dielectric material or metallic material.

24. The method as claimed in claim 21, further comprising a step of depositing an anti-reflection coating over the first layer.

25. The method as claimed in claim 21, wherein the photo-insensitive layer comprises polymer.

26. The method as claimed in claim 21, wherein the step of depositing a photo-insensitive layer is performed with plasma enhanced chemical vapor deposition at a rate between approximately 3000 Å per minute and 000 Å per minute.

27. The method as claimed in claim 21, wherein the step of depositing a photo-insensitive layer is performed at a temperature lower than a stability temperature of the patterned and defined photoresist layer.

28. A semiconductor manufacturing method, comprising:
defining a substrate;
depositing a layer of semiconductor material over the substrate;
providing a layer of hardmask over the layer of semiconductor material;
patterning and defining the hardmask layer to form at least two hardmask structures, wherein each hardmask structure includes at least one substantially vertical sidewall and one substantially horizontal top, and wherein the hardmask structures are separated by a first space;
depositing a photo-insensitive material over the at least two hardmask structures and the layer of semiconductor material, wherein an amount of the photo-insensitive material deposited on the top of the hardmask structures is substantially greater than an amount of the photo-insensitive material deposited on the at least one sidewall of the hardmask structures, wherein the hardmask structures with the photo-insensitive layer on the sidewalls thereof are separated by a second space, and wherein the first space is greater than the-second space;
etching the photo-insensitive material and the layer of the semiconductor material; and
removing the at least two hardmask structures.

* * * * *